(12) United States Patent
Nishimura et al.

(10) Patent No.: US 11,489,512 B2
(45) Date of Patent: Nov. 1, 2022

(54) RESONATOR AND RESONANCE DEVICE

(71) Applicant: Murata Manufacturing Co., Ltd., Nagaokakyo (JP)

(72) Inventors: Toshio Nishimura, Nagaokakyo (JP); Ville Kaajakari, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 423 days.

(21) Appl. No.: 16/705,851

(22) Filed: Dec. 6, 2019

(65) Prior Publication Data

US 2020/0119714 A1    Apr. 16, 2020

Related U.S. Application Data

(63) Continuation of application No. PCT/JP2018/009059, filed on Mar. 8, 2018.

(60) Provisional application No. 62/528,590, filed on Jul. 5, 2017.

(51) Int. Cl.
*H03H 9/24* (2006.01)
*H03H 9/05* (2006.01)
*H03H 9/10* (2006.01)

(52) U.S. Cl.
CPC ........ *H03H 9/2463* (2013.01); *H03H 9/0595* (2013.01); *H03H 9/1057* (2013.01)

(58) Field of Classification Search
CPC ............................................ H03H 2009/2442
See application file for complete search history.

(56) References Cited

U.S. PATENT DOCUMENTS

| 4,612,471 A * | 9/1986 | Nakamura | H03H 9/0595 310/368 |
| 5,548,180 A | 8/1996 | Kaida | |
| 2005/0046518 A1* | 3/2005 | Zurcher | H03H 3/0077 333/186 |

FOREIGN PATENT DOCUMENTS

| JP | S60232710 A | 11/1985 |
| JP | H07147526 A | 6/1995 |
| JP | 3139274 B2 | 2/2001 |

OTHER PUBLICATIONS

International Search Report issued for PCT/JP2018/009059 dated Apr. 24, 2018.
Written Opinion of the International Searching Authority issued for PCT/JP2018/009059 dated Apr. 24, 2018.

* cited by examiner

*Primary Examiner* — Jeffrey M Shin
(74) *Attorney, Agent, or Firm* — ArentFox Schiff LLP

(57) ABSTRACT

A vibrator is provided that includes a substrate having a major surface defined in width and length directions and one or more electrodes formed at least in a substantial entire region of the major surface of the substrate in the length direction, and that performs, as main vibration, expansion-contraction vibration along the width direction in accordance with a voltage applied to the electrodes. Moreover, a holder surrounds at least a portion of the vibrator; and a holding arm connects the vibrator to the holder. Moreover, the vibrator has a width Wo in the width direction positioned at an end in the length direction and includes, to have a width Wm differing from the width Wo and positioned between a pair of ends opposing in the length direction, a variant portion at least one or more locations that is in a shape recessed or projecting in the width direction.

18 Claims, 17 Drawing Sheets

RESONATOR AND RESONANCE DEVICE

CROSS REFERENCE TO RELATED APPLICATIONS

The present application is a continuation of PCT/JP2018/009059 filed Mar. 8, 2018, which claims priority to U.S. Patent Provisional Application No. 62/528,590, filed Jul. 5, 2017, the entire contents of each of which are incorporated herein by reference.

TECHNICAL FIELD

The present invention relates to a resonator that vibrates in a contour vibration mode and a resonance device.

BACKGROUND

Conventionally, resonators using MEMS (Micro Electro Mechanical Systems) technology are used as, for example, timing devices. Such resonators are mounted on a printed board incorporated in an electronic device, such as a smartphone. In MEMS resonators, many vibration modes are present, and, in a MHz band, a contour vibration mode is generally used.

In technology of resonators, vibration confinement performance is one of important characteristics. Specifically, it is known that, in the contour vibration mode, an end surface of a resonator serves as a node point at a predetermined aspect ratio (size in a length direction relative to a width direction), and confinement performance is improved (for example, Patent Document 1).

Patent Document 1: Japanese Patent No. 3139274.

Incidentally, when a direction in which displacement due to vibrations is relatively large is a width direction, and a direction in which displacement is small is a length direction, a frequency of a resonator is generally determined by a dimension in the width direction. Therefore, when downsizing of a resonator is taken into consideration, an aspect ratio is required to be reduced to obtain a desired frequency. In this case, depending on a selected aspect ratio, there is a case in which confinement performance becomes inappropriate.

SUMMARY OF THE INVENTION

The exemplary embodiments of the present invention are developed in consideration of such a circumstance, and an object of the present invention is to improve confinement performance at an arbitrary aspect ratio.

Accordingly, a resonator in one exemplary aspect includes a vibrator that includes a substrate having a major surface specified in width and length directions and one or more electrodes formed on the major surface of the substrate, and that performs, as main vibration, expansion-contraction vibration along the width direction in accordance with a voltage applied to the electrodes. Moreover, the resonator includes a holder disposed to surround at least a portion of the vibrator; and a holding arm connecting the vibrator to the holder. The vibrator has a width Wo in the width direction positioned at an end in the length direction and includes, to have a width Wm differing from the width Wo and positioned between a pair of ends opposing in the length direction, a variant portion at least one or more locations, the variant portion being formed into a shape recessed or projecting in the width direction.

According to the exemplary embodiments of the present invention, confinement performance can be improved at an arbitrary aspect ratio.

DETAILED DESCRIPTION OF EMBODIMENTS

Exemplary Embodiment

Figure 1:
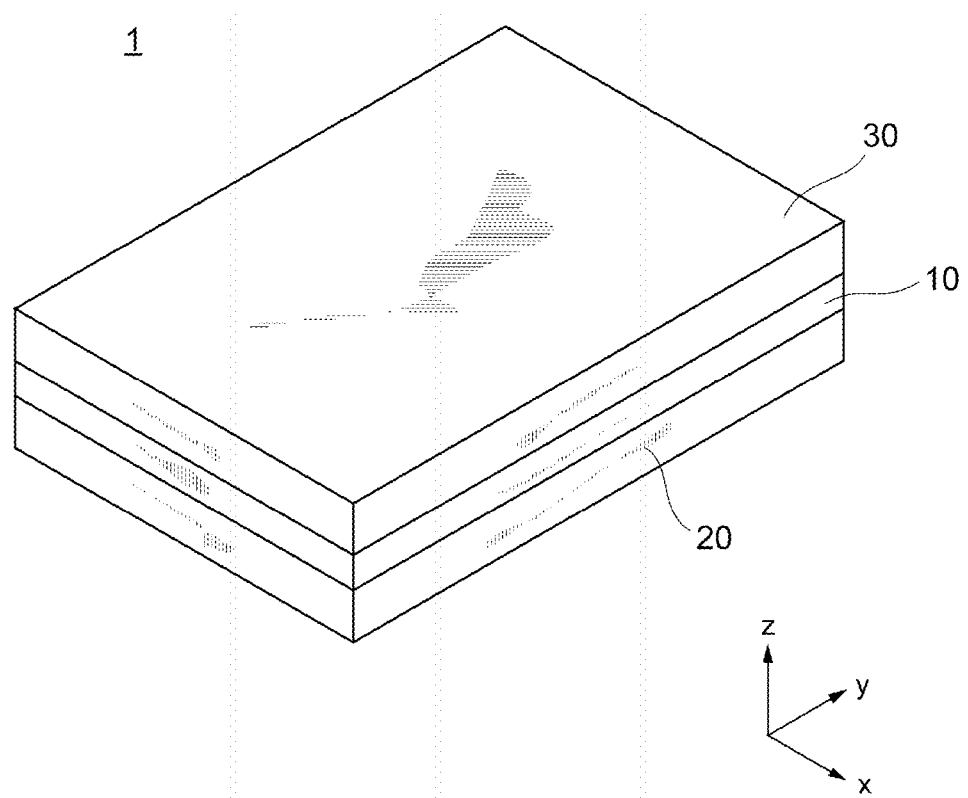
FIG. 1 is a perspective view schematically illustrating an appearance of a resonance device according to an exemplary embodiment of the present invention.
Figure 2:
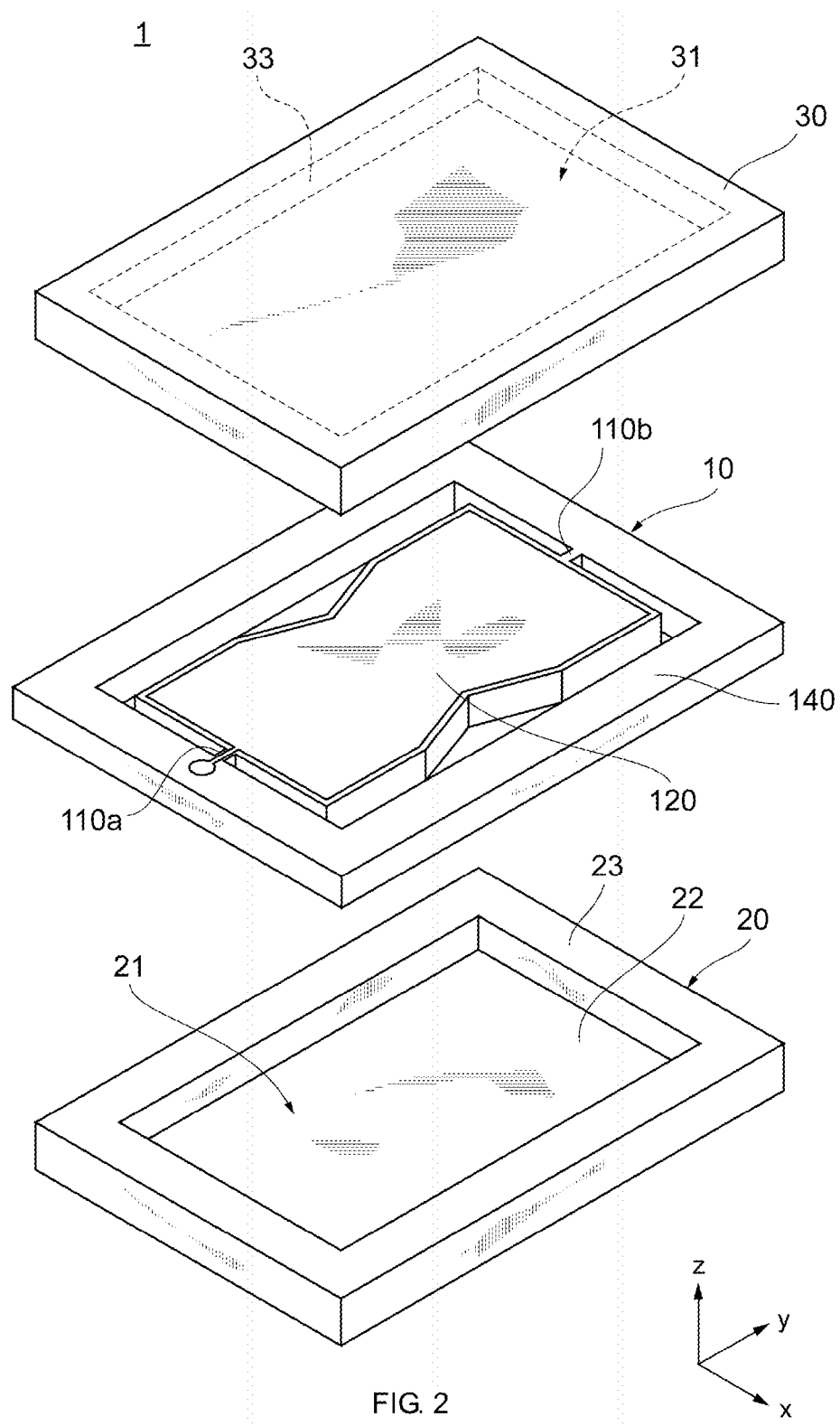
FIG. 2 is an exploded perspective view schematically illustrating a structure of the resonance device according to the exemplary embodiment of the present invention.

Hereinafter, with reference to the attached drawings, an exemplary embodiment of the present invention will be described. FIG. 1 is a perspective view schematically illustrating an appearance of a resonance device 1 according to the exemplary embodiment. In addition, FIG. 2 is an exploded perspective view schematically illustrating a structure of the resonance device 1 according to the exemplary embodiment.

As shown, the resonance device 1 includes a resonator 10, and an upper cover 30 and a lower cover 20 disposed with the resonator 10 therebetween. In other words, the resonance device 1 is formed by the lower cover 20, the resonator 10, and the upper cover 30 that are stacked in this order.

In addition, the resonator 10, and the lower cover 20 and the upper cover 30 are joined together, thereby sealing the resonator 10 and forming a vibration space for the resonator 10. The resonator 10, the lower cover 20, and the upper cover 30 are each formed using a Si substrate. In addition, the resonator 10, the lower cover 20, and the upper cover 30 are, with the Si substrates joined to each other, joined to each other. The resonator 10 and the lower cover 20 may be formed using a SOI substrate.

According to an exemplary aspect, the resonator 10 is a MEMS resonator manufactured by using MEMS technology. Note that, in the present embodiment, the resonator 10 that is formed using a silicon substrate (Si substrate) is described as an example. However, the silicon substrate is not limited to a silicon substrate made of only a silicon material but includes a silicon substrate in which an N-type semiconductor material, such as P (phosphorus), is doped (for example, a silicon substrate made of a degenerate semiconductor), as described later.

Hereinafter, each component of the resonance device 1 will be described in detail.

Upper Cover 30

The upper cover 30 extends along an XY plane in a flat plate shape, and a recess 31 that has, for example, a flat rectangular parallelepiped shape is formed in a rear surface thereof. The recess 31 is surrounded by a side wall 33 and forms a portion of the vibration space, which is a space in which the resonator 10 vibrates.

Lower Cover 20

The lower cover 20 has a bottom plate 22 that has a rectangular flat plate shape and that is disposed along the XY plane, and a side wall 23 that extends from a peripheral portion of the bottom plate 22 in a Z-axis direction (that is, a stacking direction of the lower cover 20 and the resonator 10). In the lower cover 20, at a face facing the resonator 10, a recess 21 that is formed by a surface of the bottom plate 22 and an inner surface of the side wall 23 is disposed. The recess 21 forms a portion of the vibration space for the resonator 10. By the upper cover 30 and the lower cover 20 described above, the vibration space is sealed in an airtight manner, and the vacuum state is maintained. The vibration space may be filled with, for example, a gas, such as an inert gas.

Resonator 10

Figure 3A:
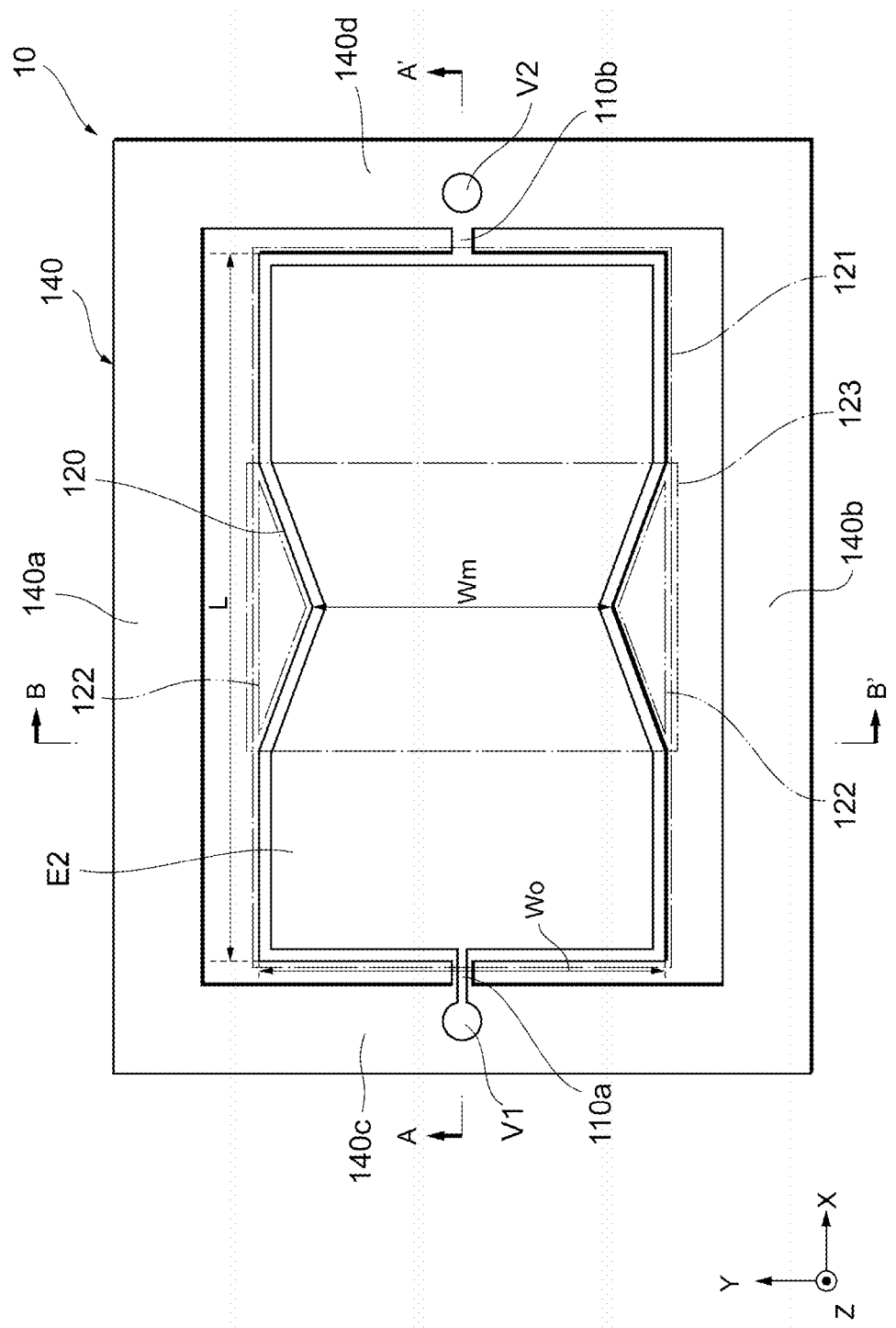
FIG. 3A is a plan view of the resonator according to the exemplary embodiment of the present invention from which an upper substrate is detached.

FIG. 3A is a plan view schematically illustrating a structure of the resonator 10 according to the present embodiment. Each component of the resonator 10 according to the present embodiment will be described using FIG. 3A. The resonator 10 includes a vibrator 120, a holder 140 (i.e., a frame), and holding arms 110a and 110b (hereinafter also collectively referred to as the "holding arms 110").

(a) Vibrator 120

As shown, the vibrator 120 has a plate shape extending along the XY plane in the orthogonal coordinate system of FIG. 3A. The vibrator 120 is disposed on the inner side of the holder 140, and, between the vibrator 120 and the holder 140, a space is formed at a predetermined interval.

When the width direction of the vibrator 120 is a direction (Y-axis direction in FIG. 3A) along a vibration direction of the vibrator 120, and the length direction is a direction (which is a direction orthogonal to the vibration direction and which is the X-axis direction in FIG. 3A) along nodes of vibrations, the vibrator 120 according to the present embodiment has a minor axis in the width direction and a major axis in the length direction.

Figure 3B:
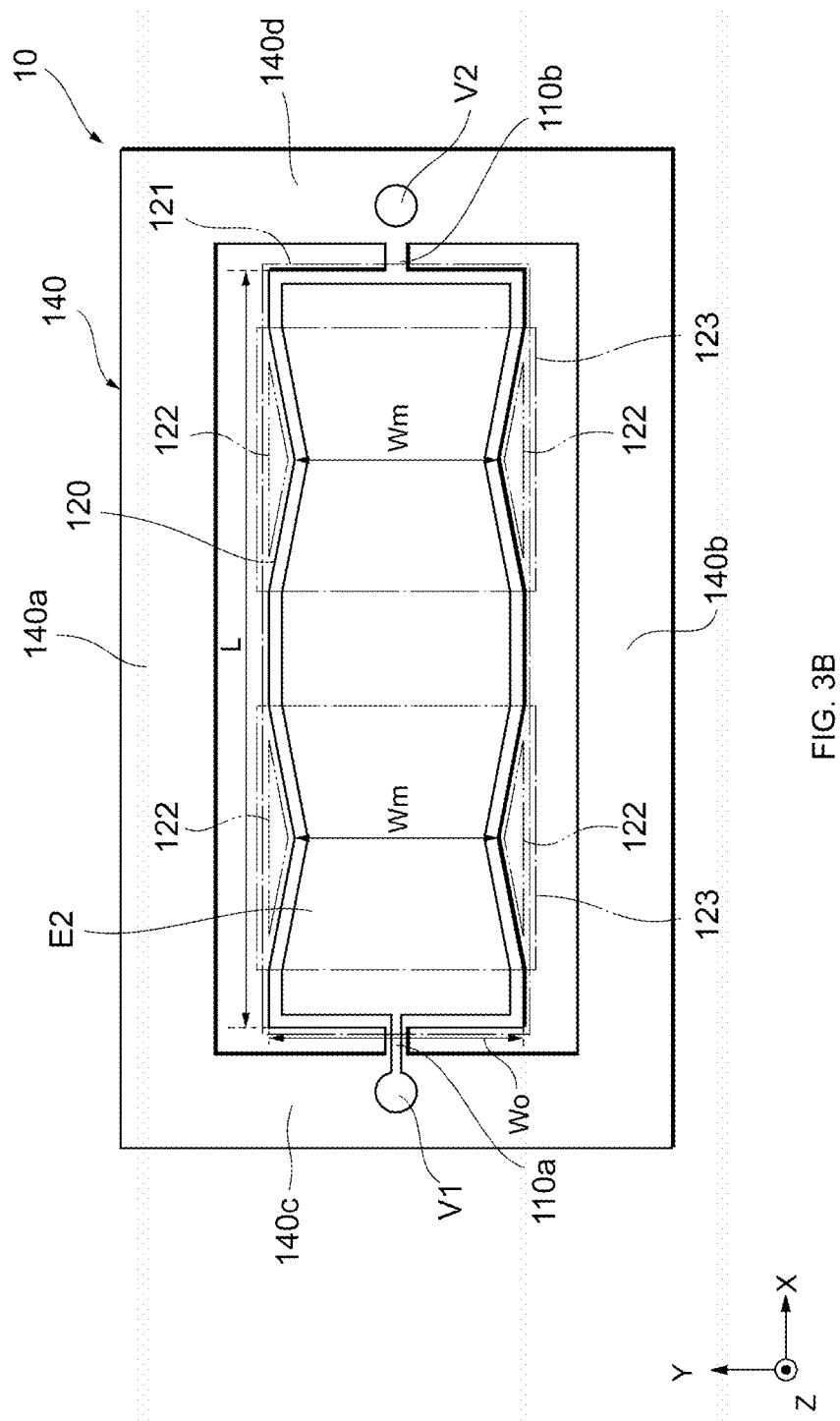
FIG. 3B is a plan view of the resonator according to the exemplary embodiment of the present invention from which the upper substrate is detached.

Here, definitions relating to the dimensions of the vibrator 120 in the present description will be described. In plan view of the XY plane in which the Y-axis direction is the width direction and the X-axis direction is the length direction, the vibrator 120 has a width Wo in the Y-axis direction positioned at an end in the X-axis direction, a width Wm differing from the width Wo and positioned between a pair of ends opposing in the X-axis direction, and a length L that is in the X-axis direction and positioned at an end in the Y-axis direction. In other words, the vibrator 120 has, at an intermediate portion in the X-axis direction, the width Wm differing from the width Wo, thereby having, at least one or more locations, a variant portion 123 formed into a shape recessed or projecting in the width direction. For example, FIG. 3A illustrates a form in which there is one variant portion, and FIG. 3B illustrates a form in which there are a plurality of variant portions. Note that, in either of FIG. 3A and FIG. 3B, the vibrator 120 in plan view is substantially constant in length.

In other words, the planar shape of the vibrator 120 is shaped by a first region 121 that has a rectangular contour and second regions (notched portions in the examples in FIG. 3A and FIG. 3B) 122 combined with the first region 121. The first region 121 in plan view of the XY plane has a pair of long sides along the length direction (X-axis direction) of the vibrator 120 and has a pair of short sides along the width direction (Y-axis direction). In the example in FIG. 3A, the second-region variant portion 123 is formed in the vicinity of the center of the first region 121 in the length direction.

The width Wm of the variant portion 123 is defined as, of a size of the vibrator 120 along the width direction, a width of a portion where displacement from the width Wo is the largest. In addition, the aspect ratio (i.e., dimension ratio) of the vibrator 120 is represented by the length L relative to the width Wo (that is, L/Wo). Note that details of the shape of the vibrator 120 will be described below.

The vibrator 120 has, at a substantial entire face thereof, a face facing a surface of a Si substrate F2 (refer to FIG. 4A) and has one upper electrode (an example of an electrode) E2 that has a shape along the contour of the vibrator 120. In FIG. 3A, the vibrator 120 has the major axis in the X-axis direction and the minor axis in the Y-axis direction. Note that the vibrator 120 may have a plurality of upper electrodes E2. In addition, the upper electrode E2 is not limited by the shape along the contour of the vibrator 120 provided that the upper electrode E2 is formed from one end to the other end of the vibrator 120 in the length direction.

Figure 4A:
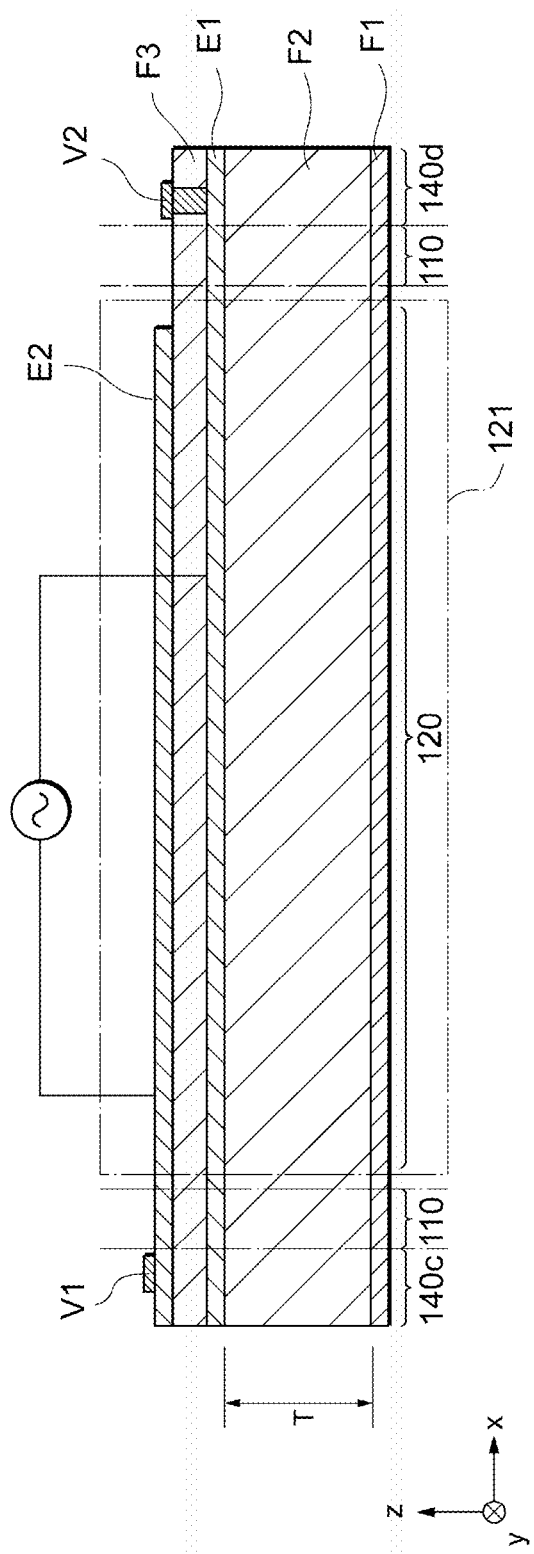
FIG. 4A is a sectional view along line AA' of FIG. 3A.
Figure 4B:
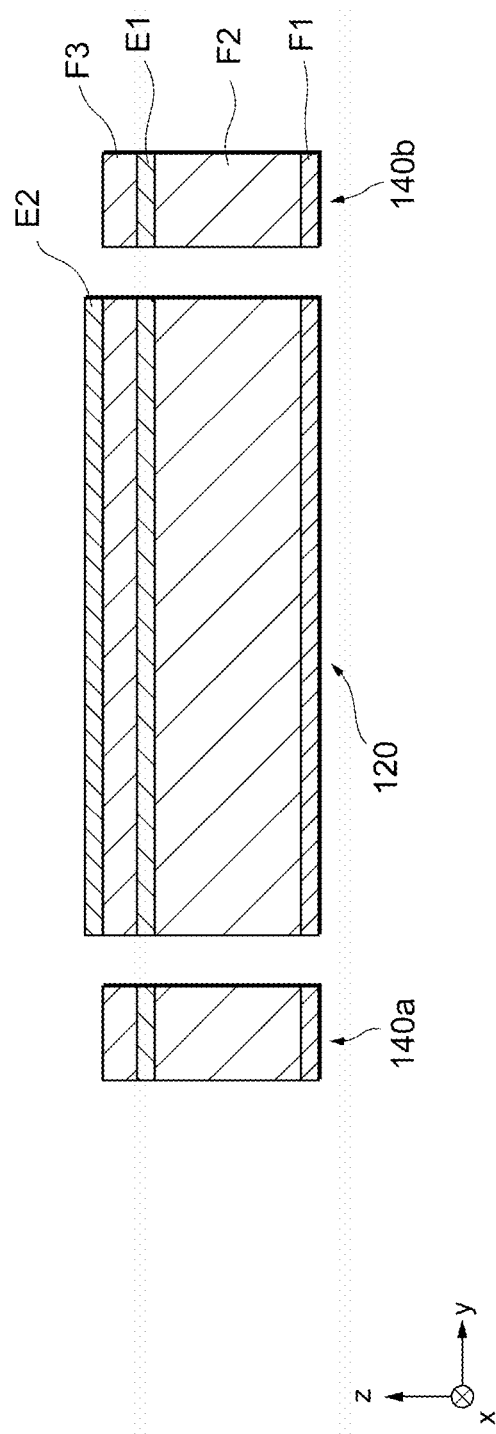
FIG. 4B is a sectional view along line BB' of FIG. 3A.

While details will be described using FIGS. 4A and 4B, the vibrator 120 has a vibration region corresponding to the upper electrode E2. The vibration region is a region that divides the vibrator 120 along the direction (that is, the length direction) along nodes of vibrations, and the vibrator 120 performs contour vibration for each vibration region. The vibration region is configured to perform, in the vibrator 120, contour vibration in the Y-axis direction with a region that links together portions connected to the holding arms 110, which will be described later, serving as nodes.

The number of vibration regions to be formed in the vibrator 120 is determined in accordance with an aspect ratio. For example, in the case of the vibrator 120, such as that illustrated in FIG. 3B, that is longer in the length direction than that in FIG. 3A, two vibration regions are formed.

(b) Holder 140

The holder 140 (i.e., a frame) is formed into a rectangular frame shape along the XY plane. The holder 140 in plan view is disposed along the XY plane to surround an outer side portion of the vibrator 120. Note that the holder 140 is not limited by the frame shape provided that the holder 140 is disposed at least a portion of the circumference of the vibrator 120. For example, the holder 140 may be disposed at the circumference of the vibrator 120 provided that the holder 140 is capable of holding the vibrator 120 and being joined with the upper cover 30 and the lower cover 20.

In the present embodiment, the holder 140 is formed by frame bodies 140a, 140b, 140c, and 140d. Note that, as illustrated in FIG. 2, the frame bodies 140a to 140c have an integrally formed rectangular columnar shape. The frame bodies 140a and 140b extend parallel to the X-axis direction, as illustrated in FIG. 3A, to face the long sides of the vibrator 120. In addition, the frame bodies 140c and 140d extend, to face the short sides of the vibrator 120, parallel to the Y-axis direction and are each connected, at both ends thereof, to both ends of the frame bodies 140a and 140b.

The frame bodies 140c and 140d are connected, at the substantial center thereof, by the holding arms 110. Moreover, the frame bodies 140c and 140d are provided with terminals V1 and V2, respectively, in the vicinity of the portions connected to the holding arms 110. The terminal V1 is a terminal for connecting the upper electrode E2 to an outside portion. In addition, the terminal V2 is a terminal for connecting a lower electrode E1, which will be described later, to an outside portion.

(c) Holding Arms 110

The holding arms 110a and 110b (hereinafter also collectively referred to as the "holding arms 110") are arms having a rectangular columnar shape and disposed, on the inner side of the holder 140, in a space between the short sides of the vibrator 120 and the frame bodies 140c and 140d. The holding arms 110a and 110b connect the short sides of the vibrator 120 to the frame bodies 140c and 140d, respectively.

On a surface of the holding arm 110a, the upper electrode E2 is formed to extend from the vibrator 120 to the frame body 140c.

Stack Structure

A stack structure of the resonator 10 will be described using FIGS. 4A and 4B. FIG. 4A is an AA' sectional view of FIG. 3A, and FIG. 4B is a BB' sectional view of FIG. 3A.

In the resonator 10 according to the present embodiment, the holder 140, the vibrator 120, and the holding arms 110 are integrally formed in the same process. As illustrated in FIGS. 4A and 4B, in the resonator 10, first, on the Si (silicon) substrate F2 (an example of a substrate), the lower electrode E1 is stacked. Then, on the lower electrode E1, a piezoelectric thin film F3 (an example of a piezoelectric body) is stacked to cover the lower electrode E1, and further, on the piezoelectric thin film F3, the upper electrode E2 is stacked.

The Si substrate F2 is formed of, for example, a degenerated n-type Si semiconductor having a thickness of approximately 10 μm and can contain, as an n-type dopant, P (phosphorus), As (arsenic), Sb (antimony), or the like. The resistance value of regenerated Si used in the Si substrate F2 is, for example, approximately 0.53 mΩ·cm or more and 0.56 mΩ·cm or less. In addition, a thickness T of the Si substrate F2 is, for example, approximately 10 μm or more and 30 μm or less.

Further, on a lower surface of the Si substrate F2, a temperature characteristics correction layer F1 made of silicon oxide (for example, $SiO_2$) is formed. Consequently, temperature characteristics can be improved.

In the present embodiment, the temperature characteristics correction layer F1 denotes a layer having a function of reducing, at least in the vicinity of the normal temperature, a temperature coefficient (that is, a rate of change per temperature) of frequency at the vibrator 120 when the temperature correction layer F1 is formed on the Si substrate F2, compared with a case in which the temperature characteristics correction layer F1 is not formed on the Si substrate F2. Due to the vibrator 120 having the temperature characteristics correction layer F1, it is possible to, for example, reduce a change with temperature in resonant frequency of a stack structure body constituted by the Si substrate F2 and the lower electrode E1, the upper electrode E2 and the piezoelectric thin film F3, and the temperature correction layer F1. In the present embodiment, the thickness of the temperature characteristics correction layer F1 is approximately 0.2 μm or more and 2.0 μm or less.

In the resonator 10, the temperature characteristics correction layer F1 is preferably formed with a uniform thickness. It is also noted that the uniform thickness denotes that variation in the thickness of the temperature characteristics correction layer F1 is within ±20% from an average value of the thickness.

Note that the temperature characteristics correction layer F1 may be formed on the upper surface of the Si substrate F2 or may be formed on both the upper surface and the lower surface of the Si substrate F2. In addition, in the present embodiment, at least the vibrator 120 and the holding arms 110 are integrally formed by the same Si substrate F2 and the same temperature characteristics correction layer F1. Note that, at the holder 140, the temperature characteristics correction layer F1 may not be formed on the lower surface of the Si substrate F2.

In addition, the upper electrode E2 and the lower electrode E1 are formed using Mo (molybdenum), aluminum (Al), or the like. It is noted that, by using degenerated Si as the Si substrate F2, the Si substrate F2 is enabled to also serve as the lower electrode E1. In other words, when the Si substrate F2 has a function as a lower electrode, the configuration of the lower electrode E1 can be omitted. In the present embodiment, the thickness of the lower electrode E1 is, for example, approximately 0.1 μm, and the thickness of the upper electrode E2 is, for example, approximately 0.2 μm.

The upper electrode E2 and the lower electrode E1 are formed, by etching or the like, into a desired shape. The lower electrode E1 is formed to function, for example, on the vibrator 120, as an electrode of a lower portion. In addition, the lower electrode E1 is formed to function, on the holding arms 110 and the holder 140, as wiring for connecting the lower electrode to an alternating current power source, with the terminal V2 interposed therebetween, that is disposed outside of the resonator 10.

In contrast, the upper electrode E2 is formed to function, on the vibrator 120, as an electrode of an upper portion. In addition, the upper electrode E2 is formed to function, on the holding arms 110 and the holder 140, as wiring for connecting the upper electrode to the alternating current power source, with the terminal V1 interposed therebetween, that is disposed outside of the resonator 10.

The terminal V2 is formed to be connected to the lower electrode E1 with a via interposed therebetween, which will be described later, formed in the piezoelectric thin film F3. In addition, the terminal V1 is formed on the upper electrode E2. The terminals V1 and V2 are formed using, for example, Mo (molybdenum), Al (aluminum), or the like.

For connection from the alternating current power source to the terminals V1 and V2, a configuration in which an electrode (an example of an outer electrode) is formed on an external surface of the upper cover 30, the electrode connecting the alternating current power source, which is an outer power source, and lower wiring or upper wiring to each other or a configuration in which a via is formed in the upper cover 30 and wiring is provided by filling an inner portion of the via with an electrically conductive material, the wiring connecting the alternating current power source and the lower wiring or the upper wiring to each other may be used.

The piezoelectric thin film F3 is a thin film of a piezoelectric body that converts an applied voltage to vibrations and can contain, for example, nitride, such as AlN (aluminum nitride), or oxide, as a main component. Specifically, the piezoelectric thin film F3 can be formed by ScAlN (scandium aluminum nitride). ScAlN is aluminum nitride in which a portion of aluminum is substituted with scandium. In addition, the piezoelectric thin film F3 has a thickness of, for example, approximately 0.8 μm.

Next, the function of the vibrator 120 will be described. In general, the vibrator 120 has a vibration region, as illustrated in FIG. 4(A). In the vibration region, the piezoelectric thin film F3 expands and contracts, in accordance with an electric field applied to the piezoelectric thin film F3 by the upper electrode E2 and the lower electrode E1, in an in-plane direction of the XY plane, that is, in the Y-axis direction. Specifically, the piezoelectric thin film F3 is oriented in a c-axis direction, and thus, when a predetermined potential difference is formed between the upper electrode E and the lower electrode E1 by applying a predetermined electric field to the upper electrode E2 and the lower electrode E1, the piezoelectric thin film F3 expands and contracts in the XY in-plane direction in accordance with the potential difference, and the vibration region thereby performs expansion-contraction vibration (contour vibration).

Detailed Configuration of Vibrator 120

Figure 5:
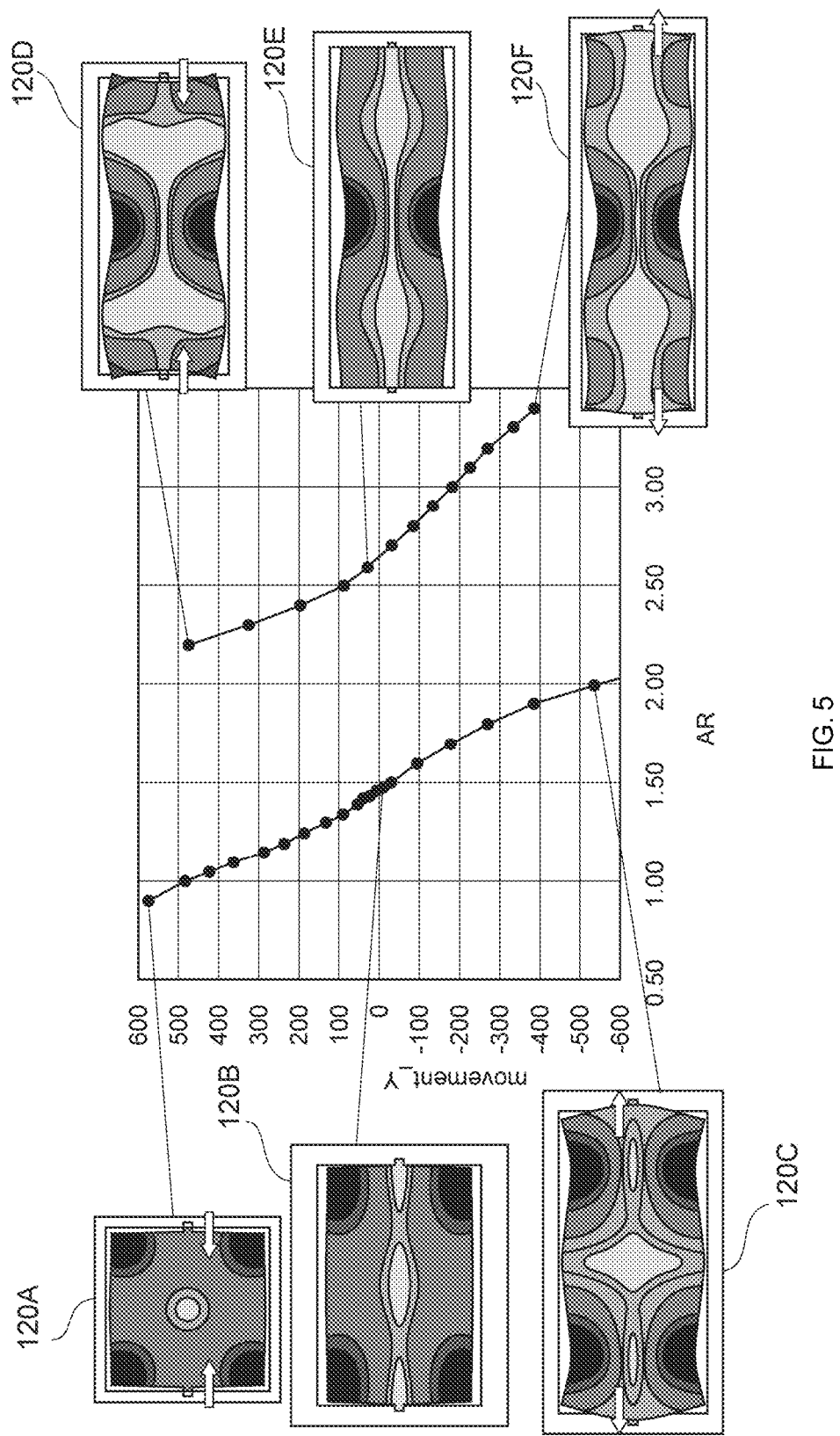
FIG. 5 is a graph illustrating results of tests using the resonator according to the exemplary embodiment of the present invention.

First, displacement of vibrations of a conventional vibrator 120 in the X-axis direction (that is, the length direction) when an aspect ratio is changed will be described using FIG. 5. In FIG. 5, the horizontal axis is an aspect ratio (AR), and the vertical axis is a displacement amount (hereinafter also simply referred to as the "displacement amount in the length direction") of the portions joined to the holding arms 110 in the length direction of the vibrator 120. It is noted that the tests whose results are indicated in FIG. 5 were performed by using FEM, and the displacement amount of the holding arms in the length direction was quantified by subjecting the displacement amount in the length direction to surface integration with a section of the holding arms 120. In addition, in the vibrators A to F indicated in FIG. 5, light-colored regions indicate regions in which displacement due to vibrations is small, and dark-colored regions indicate regions in which displacement due to vibrations is large.

Here, a displacement amount of zero in the length direction at the center of the vibrator 120 in the width direction denotes a state (the states of 120B and 120E in FIG. 5) in which nodes (node) of vibrations are formed, along the length direction, from one end to the other end of the vibrator 120. In other words, in this state, vibrations in the width direction and the length direction are appropriately combined, and thus, expansion-contraction timing of the vibrator 120 in the width direction and the length direction are in opposite phases. As a result, the vibrator 120 is enabled, by being connected at the nodes of vibrations to the holding arms 110, to reduce a loss of vibrations due to holding.

In contrast, in a state (region on the upper side of the graph in FIG. 5) in which the displacement amount in the length direction is positive at the center of the vibrator 120 in the width direction, combination of vibrations in the width direction and vibrations in the length direction is strong, and thus, the vibrator 120 contracts, when contracting in the width direction, also in the length direction. Consequently, nodes of vibrations concentrate, without being formed to reach end portions of the vibrator 120, at a center portion (the states of 120A and 120D in FIG. 5). In addition, in a state (region on the lower side of the graph in FIG. 5) in which the displacement amount due to vibrations in the X-axis direction is negative at the center of the vibrator 120 in the width direction, combination of vibrations is weak, and thus, when contraction is performed in the width direction, extension is excessively performed in the length direction (the states of 120C and 120F in FIG. 5). In these cases, when the vibrator 120 is held by the holding arms 110, a loss due to holding is generated.

It is noted that the state in which the displacement amount in the length direction is positive at the center of the vibrator 120 in the width direction denotes, specifically, a state in which combination of vibrations in the width direction and the length direction is strong and in which, when contraction/extension is performed in the width direction, contraction/extension is performed in the length direction. In addition, the state in which the displacement amount in the length direction is negative at the center of the vibrator 120 in the width direction denotes, specifically, a state in which combination of vibrations in the width direction and the length direction is weak and in which, when contraction/extension is performed in the width direction, extension/contraction is performed in the length direction.

Thus, in the conventional vibrator 120, when the vibrator 120 is formed so as not to cause a loss of vibrations due to the holder 140 holding the vibrator 120, an available aspect ratio is discretive. In this point, in the vibrator 120 according to the present embodiment, it is possible due to including the variant portion 123 to use aspect ratios that have not been available in conventional designs.

Hereinafter, a configuration of the vibrator 120 will be described in detail. Note that the shape of the variant portion 123 of the vibrator 120 varies depending on whether an aspect ratio set for the vibrator 120 corresponds to a region in which displacement of the portions joined to the holding arms 110 in the length direction in FIG. 5 is in a positive direction or corresponds to a region in which the displacement is in a negative direction. Therefore, description will be provided below individually for a case in which a numerical range of the aspect ratio corresponds to the region in which the displacement of the portions joined to the holding arms 110 in the length direction is positive and a case in which the numerical range of the aspect ratio corresponds to the region in which the displacement is negative.

(1) When Corresponding to Region in Which Displacement Amount in Length Direction Is Positive (Aspect Ratio: 1.0 n or more and less than 1.45 n (where n is a natural number and indicates the number of vibration regions to be formed))

With reference to FIG. 3A and FIG. 3B, a configuration of the vibrator 120 in this region will be described in detail. In this case, the variant portion 123 denotes a region (recessed portion) whose width is smaller than the width Wo, and the width Wm means the smallest width of the vibrator 120. FIG. 3A is a configuration when only one vibration region is formed (n=1), and FIG. 3B is a configuration when two vibration regions are formed (n=2).

The variant portions 123 are each formed at a center portion of respective vibration regions in the length direction. In FIG. 3A and FIG. 3B, the shape of the variant portion 123 is a polygonal shape but not limited thereto, and may be an arc shape according to an alternative aspect. In addition, the variant portions 123 may have recesses and projections at the periphery thereof.

(2) When Corresponding to Region in Which Displacement Amount in Length Direction is Negative (Aspect Ratio: 1.45 n or more and less than 2.0 n)

Figure 6A:
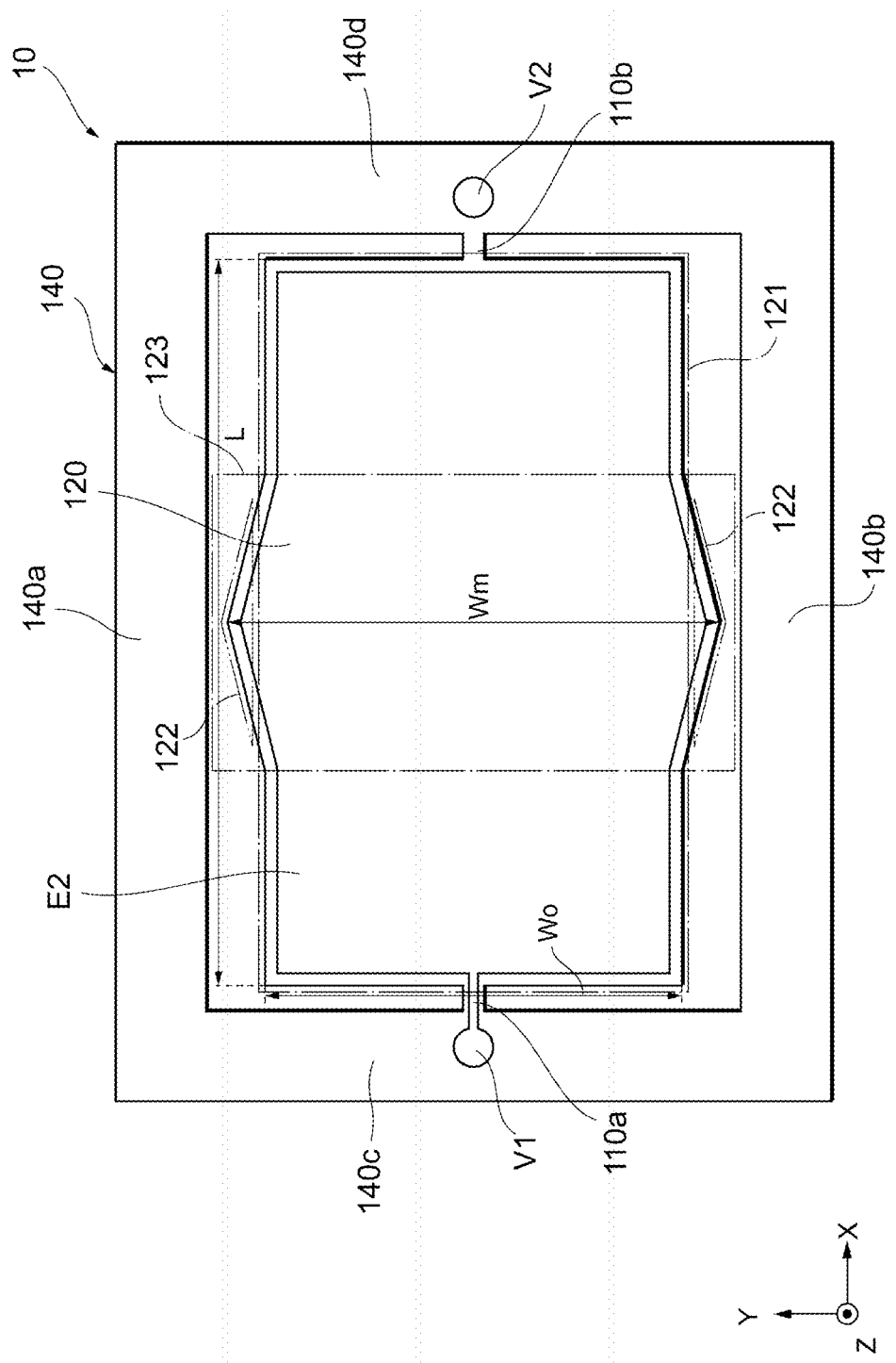
FIG. 6A is a plan view of the resonator according to the exemplary embodiment of the present invention from which the upper substrate is detached.
Figure 6B:
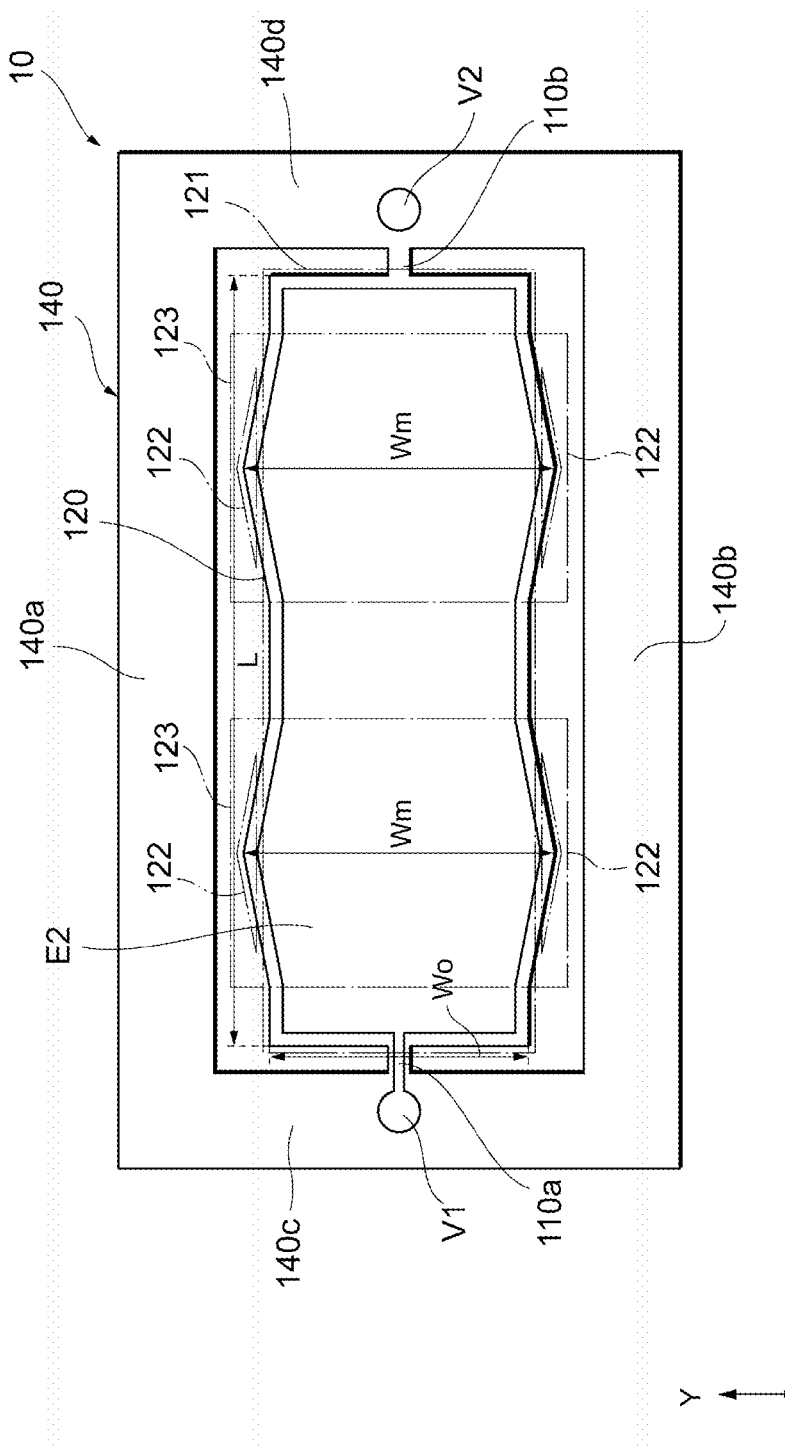
FIG. 6B is a plan view of the resonator according to the exemplary embodiment of the present invention from which the upper substrate is detached.

With reference to FIG. 6A and FIG. 6B, a configuration of the vibrator 120 in this region will be described in detail. In this case, the variant portion 123 denotes a region (projected portion) whose width is larger than the width Wo, and the width Wm means the largest width of the vibrator 120. FIG. 6A is a configuration when only one vibration region is formed (n=1), and FIG. 6B is a configuration when two vibration regions are formed (n=2).

Also in this case, the variant portions 123 are each formed at a center portion of respective vibration regions in the length direction, as is in (1) above.

(3) Expression by General Formulas

Regarding the vibrator 120 that has the variant portions 123 of (1) and (2) above, expression by general formulas when an effective aspect ratio is represented by x will be described. Here, the effective aspect ratio means an aspect ratio per one vibration region and is a value defined by the following formula (1) when the number of vibration regions is represented by n (n is a positive integer).

[Math. 1]

$$\begin{cases} x = \dfrac{L}{Wo}, & (n = 1) \\ x = \left(\dfrac{L}{Wo}\right) \times \left(\dfrac{1.1}{n}\right), & (n \geq 2) \end{cases} \quad (1)$$

A relational expression indicating the shape of the variant portion 123 is determined by a rotation angle of Si forming the Si substrate F2. Here, a case in which the width direction of the resonator is along [100] and a case in which the width direction of the resonator is along [110] will be described.

In Case of Si Rotation Angle [100]

Figure 7A:
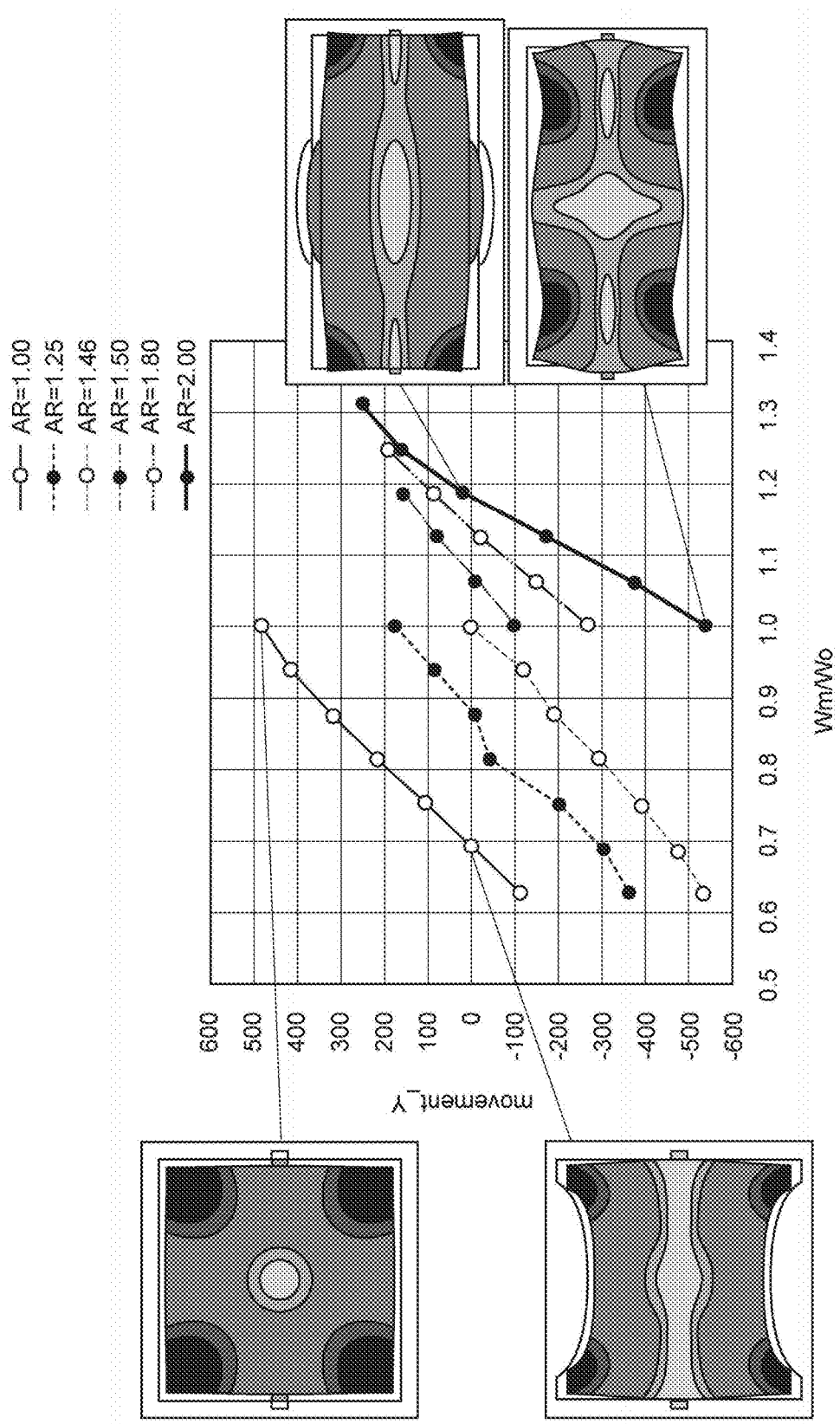
FIG. 7A is a graph illustrating results of tests using the resonator according to the exemplary embodiment of the present invention.
Figure 7B:
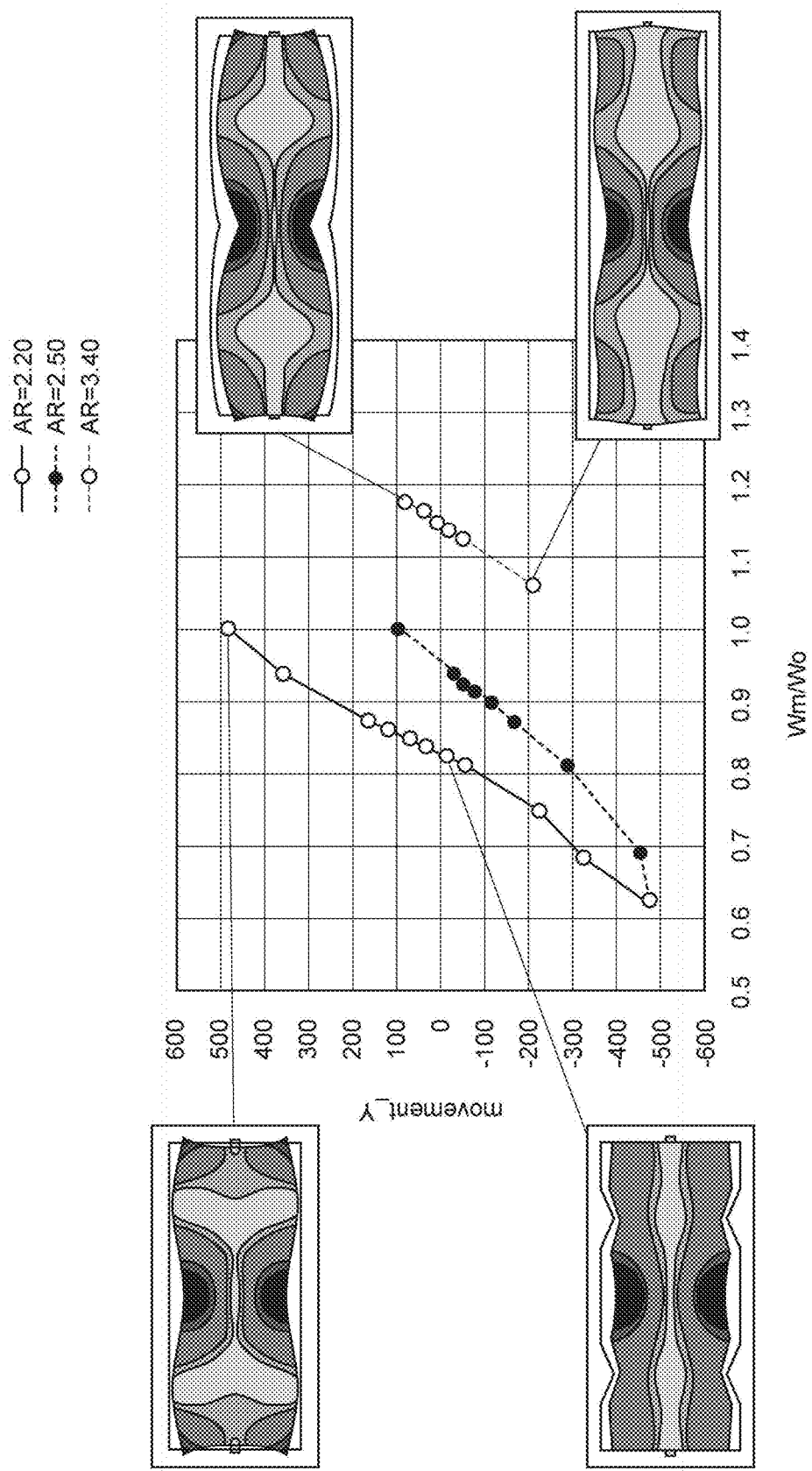
FIG. 7B is a graph illustrating results of tests using the resonator according to the exemplary embodiment of the present invention.

FIG. 7A and FIG. 7B are graphs indicating results obtained by testing the displacement amount of the portions joined to the holding arms 110 in the length direction due to vibrations, in the case of Si rotation angle [100], when the width Wm of the variant portion 123 is varied in each of the vibrators 120 having aspect ratios of a plurality of types. The horizontal axis is a ratio of widths Wm/Wo, and the vertical axis is the displacement amount of the portions joined to the holding arms 110 in the length direction due to vibrations. FIG. 7A is test results for the vibrator 120 in which there is one (n=1) vibration region, and FIG. 7B is test results for the vibrator 120 in which there are two (n=2) vibration regions.

In addition, in FIG. 7A, the relation between graphs and aspect ratios is as follows:

aspect ratio 1.00:graph of solid line (white circle)
aspect ratio 1.25:graph of dashed line (black circle)
aspect ratio 1.46:graph of dotted line (white circle)
aspect ratio 1.60:graph of one-dot chain line (black circle)
aspect ratio 1.80:graph of two-dot chain line (white circle)
aspect ratio 2.00:graph of bold line (black circle)

In FIG. 7B, the relation between graphs and aspect ratios is as follows:

aspect ratio 2.20:graph of solid line (white circle)
aspect ratio 2.50:graph of dashed line (black circle)
aspect ratio 3.40:graph of dotted line (white circle)

Figure 8A:
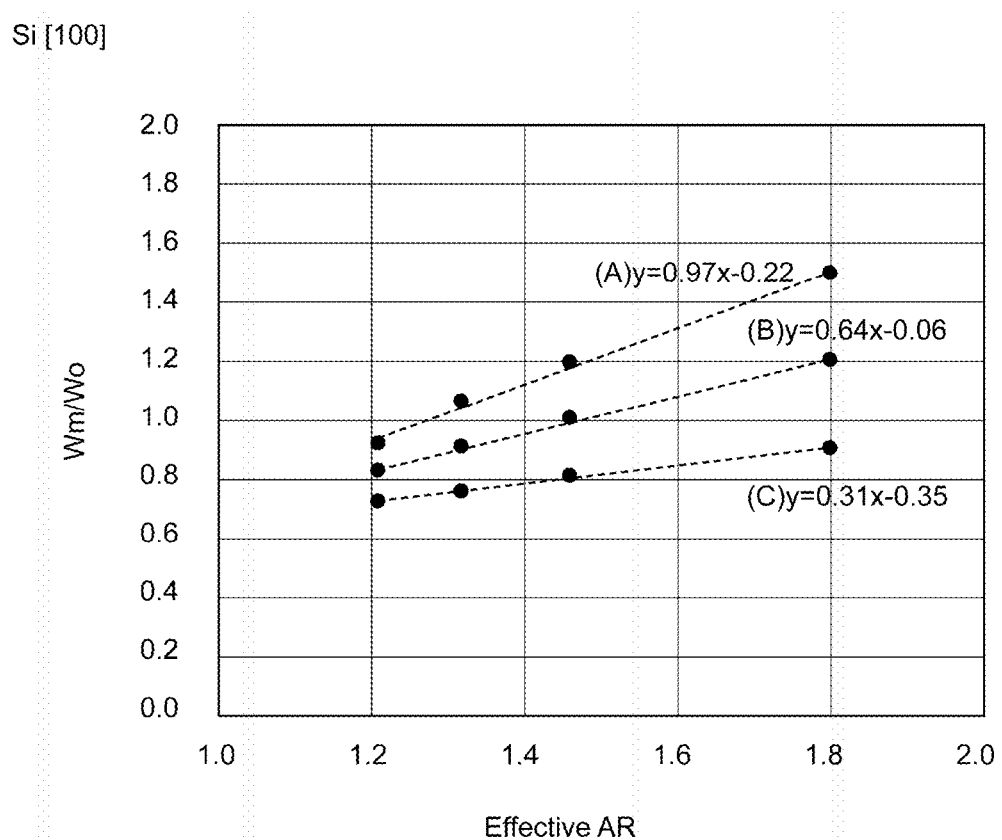
FIG. 8A is a graph illustrating results of tests using the resonator according to the exemplary embodiment of the present invention.

FIG. 8A is a graph plotted, regarding the vibrator 120 in which the displacement amount in the length direction is approximately zero in the graphs of FIG. 7A and FIG. 7B, with the horizontal axis as the aspect ratio and the vertical axis as the ratio of widths Wm/Wo. The three straight lines of (A) y=0.97 x−22, (B) y=0.64 x+0.06, and (C) y=0.31 x+0.35 each indicate a regression line.

Thus, from the graphs of FIG. 8A, FIG. 7A, and FIG. 7B, it is found that, when the ratio of widths Wm/Wo is a value between the straight line (A) and the straight line (C) in FIG. 8A in the vibrators 120 having respective aspect ratios, the displacement amount of the vibrator 120 in the length direction due to vibrations is approximately zero. Therefore, the relation among the length L, the width Wo, and the Width Wm when the displacement amount in the length direction due to vibrations is approximately zero is expressed by the following formula (2) by using the effective aspect ratio x.

[Math. 2]

$$0.31x + 0.35 \leq \dfrac{Wm}{Wo} \leq 0.97x - 0.22 \quad (2)$$

It is noted that the ratio of widths Wm/Wo is optimal when coinciding with the straight line (B), that is, when Wm/Wo=0.64 x+0.06.

Figure 8B:
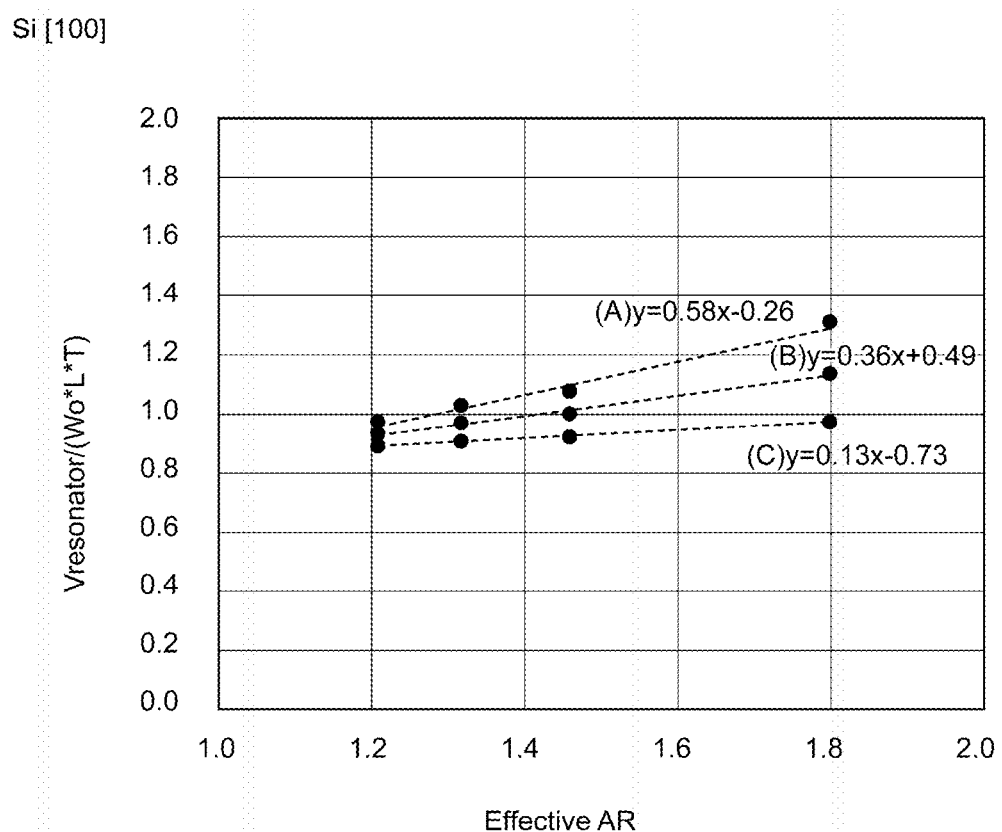
FIG. 8B is a graph illustrating results of tests using the resonator according to the exemplary embodiment of the present invention.

Similarly, FIG. 8B is a graph in which the relation between a volume Vm of the vibrator 120 and a volume Vo (that is, the product of the length L, the width Wo, and a thickness T) of a rectangular portion formed by connecting four apexes of the vibrator 120 is arranged. Specifically, FIG. 8B is a graph plotted, regarding the vibrator 120 in which the displacement amount in the length direction is approximately zero in the graphs of FIG. 7A and FIG. 7B, with the horizontal axis as the aspect ratio and the vertical axis as the ratio of volumes Vm/Vo. The three straight lines of (A) y=0.58 x+0.26, (B) y=0.36 x+0.49, and (C) y=0.13 x+0.73 each indicate a regression line.

Thus, it is found, from the graphs of FIG. 8B, FIG. 7A, and FIG. 7B, that the volume ratio Vm/Vo when the displacement amount in the length direction due to vibrations is approximately zero is a value between the straight line (A) and the straight line (C) in FIG. 8B at each aspect ratio, and therefore, the relation between the areas Vm and Vo is expressed by the following formula (3) by using the effective aspect ratio x.

[Math. 3]

$$0.31x + 0.73 \leq \dfrac{Vm}{Vo} \leq 0.58x + 0.26 \quad (3)$$

It is noted that Vm/Vo is optimal when coinciding with the straight line (B), that is, when Vm/Vo=0.36 x+0.49.

In Case of Si Rotation Angle [110]

Figure 9A:
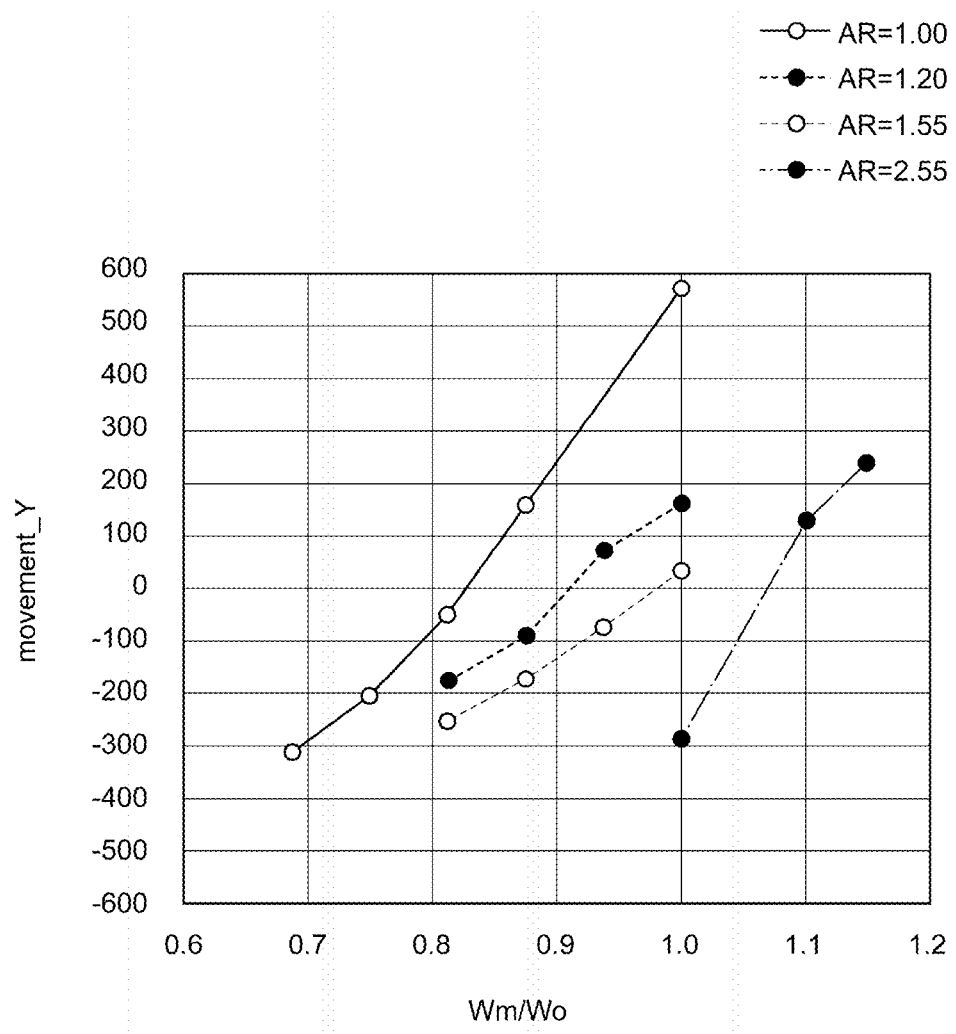
FIG. 9A is a graph illustrating results of tests using the resonator according to the exemplary embodiment of the present invention.
Figure 9B:
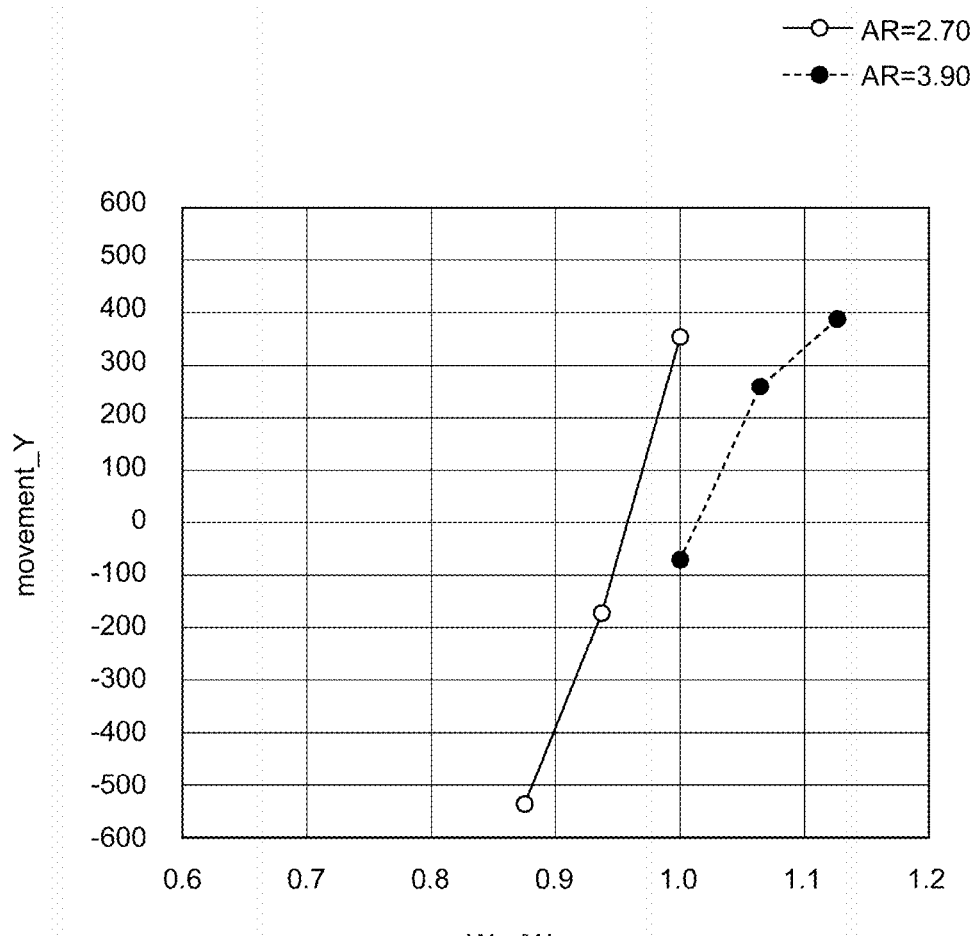
FIG. 9B is a graph illustrating results of tests using the resonator according to the exemplary embodiment of the present invention.

FIG. 9A and FIG. 9B are graphs indicating results obtained by testing the displacement amount of the holding arms 110 in the length direction of vibrations, in the case of Si rotation angle [110], when the width Wm of the variant portion 123 is varied in each of the vibrators 120 having aspect ratios of a plurality of types. The horizontal axis is the ratio of widths Wm/Wo, and the vertical axis is a displacement amount of the holding arms 110 in the length direction of vibrations. FIG. 9A is test results for the vibrator 120 in which there is one (n=1) vibration region, and FIG. 7B is test results for the vibrator 120 in which there are two (n=2) vibration regions.

In addition, in FIG. 9A, the relation between graphs and aspect ratios is as follows:
aspect ratio 1.00:graph of solid line (white circle)
aspect ratio 1.20:graph of dashed line (black circle)
aspect ratio 1.55:graph of dotted line (white circle)
aspect ratio 2.50:graph of one-dot chain line (black circle)
In FIG. 9B, the relation between graphs and aspect ratios is as follows:
aspect ratio 2.70:graph of solid line (white circle)
aspect ratio 3.90:graph of dashed line (black circle)

Figure 10A:
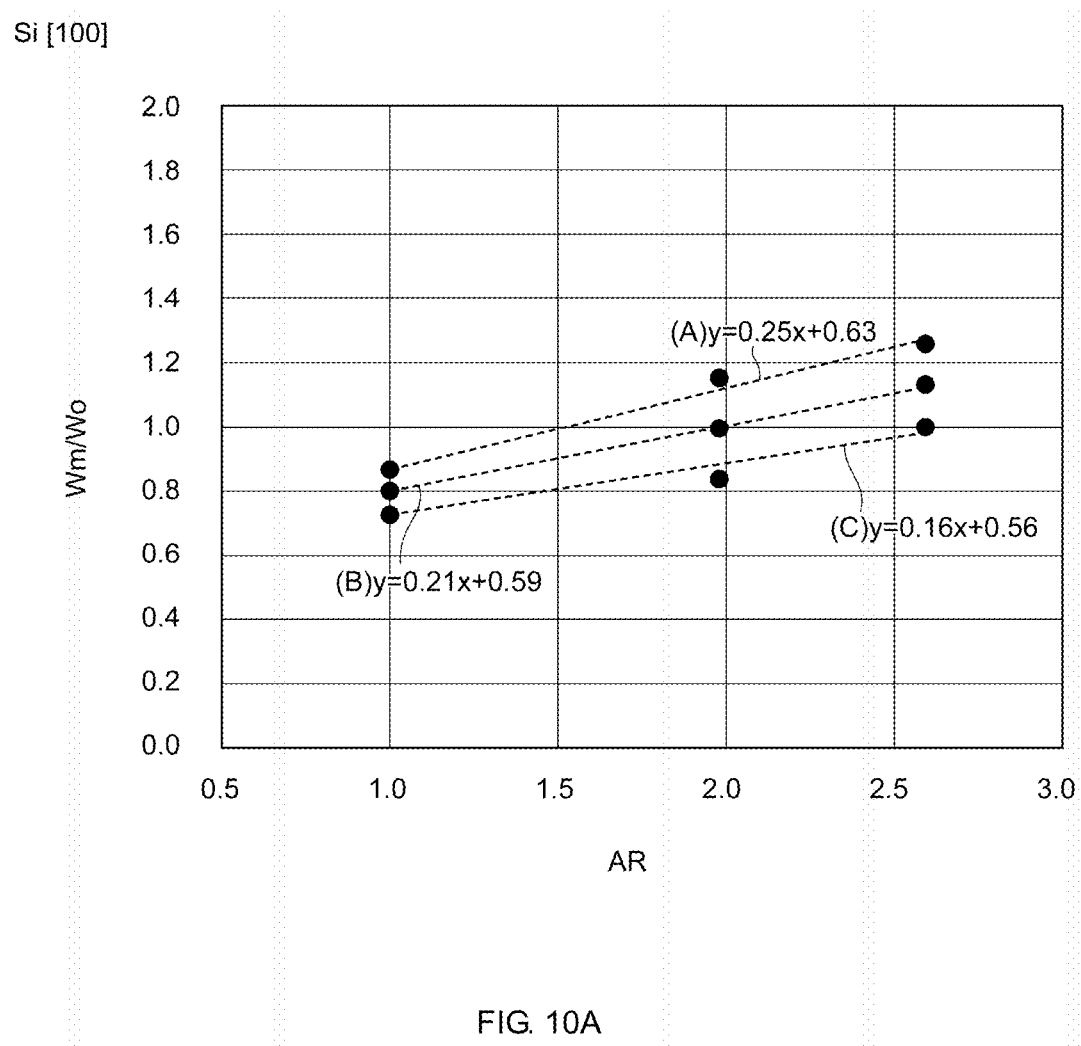
FIG. 10A is a graph illustrating results of tests using the resonator according to the exemplary embodiment of the present invention.

FIG. 10A is a graph FIG. 10A plotted, regarding the vibrator 120 in which the displacement amount in the length direction is approximately zero in the graphs of FIG. 9A and FIG. 9B, with the horizontal axis as the aspect ratio and the vertical axis as the ratio of widths Wm/Wo. Thus, the relation among the length L, the width Wo, and the width Wm when the displacement amount in the length direction due to vibrations is approximately zero is expressed by the following formula (4).

[Math. 4]

$$0.16x + 0.56 \leq \frac{Wm}{Wo} \leq 0.25x + 0.63 \quad (4)$$

It is noted that the optimal value of Wm/Wo is 0.21 x+0.59.

Figure 10B:
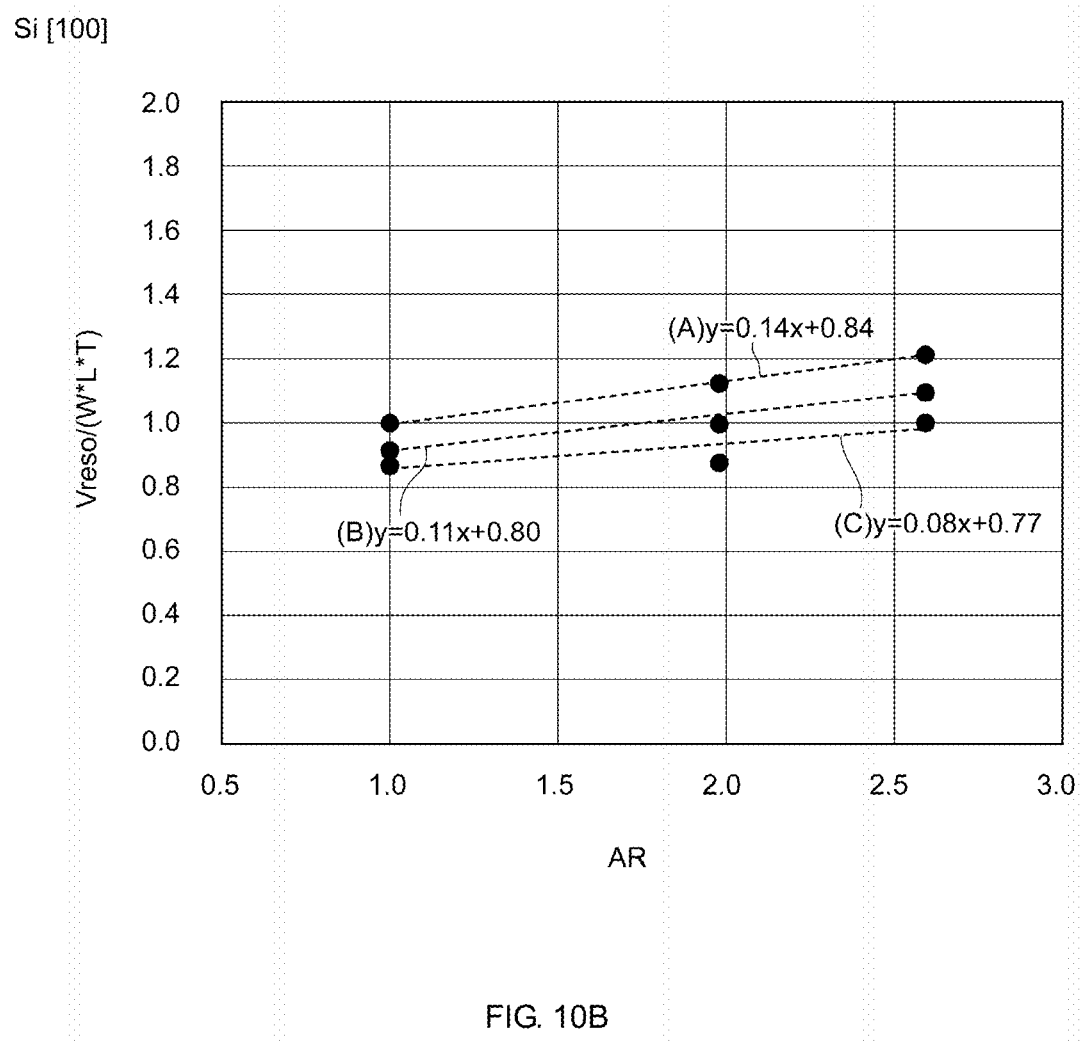
FIG. 10B is a graph illustrating results of tests using the resonator according to the exemplary embodiment of the present invention.

Similarly, FIG. 10B is a graph FIG. 10B plotted, regarding the vibrator 120 in which the displacement amount in the length direction is approximately zero in the graphs of FIG. 9A and FIG. 9B, with the horizontal axis as the aspect ratio and the vertical axis as the ratio of volumes Vm/Vo. Thus, the relation between the volume Vm and the volume Vo when the displacement amount in the length direction due to 3 vibrations is approximately zero is expressed by the following formula (5).

[Math. 5]

$$0.08x + 0.77 \leq \frac{Vm}{Vo} \leq 0.14x + 0.84 \quad (5)$$

It is noted that the optimal value of Vm/Vo is 0.11 x+0.80.

Thus, the resonator 10 according to the present embodiment is enabled by the vibrator 120 including the variant portion 123 to cause the displacement amount in the length direction due to vibrations to be approximately zero. Consequently, it is possible to improve confinement performance also at an arbitrary aspect ratio.

Additional Exemplary Embodiments

The embodiment described above is for ease of understanding the present invention and not for limiting the interpretation of the present invention. It should be appreciated that the present invention can be modified/improved without deviating from the gist thereof, and the present invention includes equivalents thereof. In other words, the embodiments to which design changes are added, as appropriate, by a person skilled in the art are included in the scope of the present invention provided that those include the features of the present invention. For example, the components included in the embodiments and the arrangement, materials, conditions, shapes, sizes, and the like thereof are not limited to those presented as examples and can be changed, as appropriate. In addition, the embodiments are presented as examples, and it is needless to say that partial replacement or combination of the configurations indicated in different embodiments is possible, and these are also included in the scope of the present invention provided that these include the features of the present invention.

For example, in the exemplary embodiment described above, a configuration in which the resonator 10 is formed using Si has been described. However, the configuration is not limited thereto. The resonator 10 may be formed by, for example, crystal. In addition, in the embodiments already mentioned, the resonator using the technology of piezoelectric MEMS has been described; however, the resonator is not limited thereto and may use the technology of electrostatic MEMS.

Exemplary embodiments of the present invention have been described above. The resonator 10 according to the present embodiment includes the vibrator 120 that includes the substrate F2 having a major surface specified in the width direction and the length direction and the one or more electrodes E2 formed on the major surface of the substrate F2, and that performs, in accordance with a voltage applied to the electrode E2, expansion-contraction vibration in which vibrations along the width direction are main vibration; the holder 140 disposed to surround at least a portion of the vibrator 120; and the holding arms 110 connecting the vibrator 120 and the holder 140 to each other, the vibrator 120 having the width Wo in the width direction positioned at an end portion in the length direction, the vibrator 120 including, at least one or more locations, the variant portion 123 formed into a shape recessed or projecting in the width direction, so as to have the width Wm differing from the width Wo and positioned between the pair of the end portions opposing in the length direction. Consequently, in the resonator 10, confinement performance can be improved at an arbitrary aspect ratio. In the examples, fundamental waves of contour vibration have been described; confinement performance can be also improved similarly in a higher mode at an arbitrary aspect ratio. In addition, the rectangular shape has been described as straight lines but is not particularly limited to the straight lines.

In addition, preferably, the vibrator 120 has the length L in the length direction positioned at an end portion in the width direction and includes one or more vibration regions formed along the length direction in accordance with a value of the aspect ratio L/Wo, which is a ratio of the length L to the width Wo, and the variant portion 123 is formed in the vicinity of the center of each of the one or more vibration regions in the length direction.

Preferably, in the vibrator 120, the region in which nodes of expansion-contraction vibration are formed is determined on the basis of the value of the aspect ratio L/Wo, and, in a first numerical range of the value of the aspect ratio L/Wo, the first numerical range being a range in which the displacement amount of expansion-contraction vibration in the length direction is positive at the center of the vibrator 120 in the width direction, the variant portion 123 is set to the width Wm that satisfies Wm<Wo.

Preferably, the substrate F2 is made of silicon, the vibrator 120 further includes the piezoelectric layer F3 formed between the substrate F2 and the electrode E2, the piezoelectric layer F3 is configured to perform expansion-contraction vibration in a plane along the major surface of the substrate F2 in accordance with a voltage applied to the electrode E2, and, in the first numerical range, the value of the aspect ratio L/Wo is set in a range of 1.0 n≤L/Wo<1.45 n when n is the number of vibration regions to be formed in the vibrator 120.

In addition, preferably, in the vibrator 120, the region in which nodes of expansion-contraction vibration are formed is determined on the basis of the value of the aspect ratio L/Wo, and, in a second numerical range of the value of the aspect ratio L/Wo, the second numerical range being a range in which the displacement amount of the expansion-contraction vibration in the length direction is negative at the center of the vibrator 120 in the width direction, the variant portion 123 is set to the width Wm that satisfies Wm >Wo.

In addition, preferably, the substrate F2 is made of silicon, the vibrator 120 further includes the piezoelectric layer F3 formed between the substrate F2 and the electrode E2, with the piezoelectric layer F3 being configured to perform expansion-contraction vibration in a plane along the major surface of the substrate F3 in accordance with a voltage applied to the electrode E2, and, in the second numerical range, the value of the aspect ratio L/Wo is set in a range of 1.45 n≤L/Wo<2.0 n.

In addition, preferably, in the vibrator 120, when the aspect ratio per vibration region in the vibrator 120 is the effective aspect ratio x, and the number of vibration regions to be formed is n, the effective aspect ratio x is set to:

$$\begin{cases} x = \dfrac{L}{W_o}, & (n = 1) \\ x = \left(\dfrac{L}{W_o}\right) \times \left(\dfrac{1.1}{n}\right), & (n \geq 2) \end{cases} \quad \text{[Math. 6]}$$

In addition, preferably, in the vibrator 120, the length direction or the width direction is a direction along a [100] plane of silicon forming the substrate F2, and the width Wm of the variant portion 123 is set to 0.31 x+0.35 Wm/Wo 0.97 x−0.22 with respect to the width Wo of the vibrator 120.

Preferably, in the vibrator 120, the length direction or the width direction is a direction along the [100] plane of silicon forming the substrate F2, and the volume Vm of the vibrator 120 is set to 0.13 x+0.73≤Vm/Vo 0.58 x+0.26 with respect to the product Vo of the length L, the width Wo, and the thickness T.

Preferably, in the vibrator 120, the length direction or the width direction is a direction along a [100] plane of silicon forming the substrate F2, and the width Wm of the variant portion 123 is set to 0.16 x+0.56≤Wm/Wo 0.25 x+0.63 with respect to the width Wo of the vibrator 120.

Preferably, in the vibrator 120, the length direction or the width direction is a direction along the [100] plane of silicon forming the substrate F2, and the volume Vm of the vibrator 120 is set to 0.08 x+0.77≤Vm/Vo 0.14 x+0.84 with respect to the product Vo of the length L, the width Wo, and the thickness T.

In addition, preferably, the holding arms 110 are connected, at ends of the vibrator 120 in the length direction, to center portions in the width direction. According to this preferable form, the holder 110 is connected, at the nodes of vibrations formed in the vibrator 120, to the vibrator 120. Consequently, it is possible to reduce a loss of vibrations due to holding and possible to improve confinement performance.

The resonance device 1 according to one embodiment of the present invention includes the aforementioned resonator 10, the cover bodies 20 and 30 that cover the resonator 10, and the outer electrode.

REFERENCE SIGNS LIST 1 resonance device
10 resonator
30 upper cover
20 lower cover
140 holder
140a to 140d frame body
110 holding arm
120 vibrator
123 variant portion
F2 Si substrate

The invention claimed is:

1. A resonator comprising:
   a vibrator that includes a substrate having a surface defined in width and length directions and at least one electrode disposed on the surface of the substrate, with the vibrator being configured to perform expansion-contraction vibration with main vibrations being along the width direction when a voltage is applied to the at least one electrode;
   a frame surrounding at least a portion of the vibrator; and
   a holding arm that connects the vibrator to the frame,
   wherein the vibrator has a width Wo in the width direction positioned at an end in the length direction, and a width Wm differing from the width Wo and positioned between a pair of ends of the resonator in the length direction,
   wherein the resonator comprises a variant portion disposed at one or more locations and that comprises a shape recessed or projecting in the width direction,
   wherein the vibrator has a length L in the length direction positioned at an end in the width direction, and includes, in accordance with a value of an aspect ratio L/Wo, one or more vibration regions disposed along the length direction, and
   wherein the variant portion is disposed in a vicinity of a center of each of the one or more vibration regions in the length direction.

2. The resonator according to claim 1, wherein, in the vibrator, a region in which a node of the expansion-contraction vibration is formed is based on the value of the aspect ratio L/Wo.

3. The resonator according to claim 2, wherein, in a first numerical range of the value of the aspect ratio L/Wo, the first numerical range is a range in which a displacement amount of the expansion-contraction vibration in the length direction is positive at a center of the vibrator in the width direction.

4. The resonator according to claim 3, wherein the variant portion is set to a width Wm satisfying Wm<Wo.

5. The resonator according to claim 4,
   wherein the substrate comprises silicon,
   wherein the vibrator further includes a piezoelectric layer formed between the substrate and the at least one electrode, and wherein the piezoelectric layer is configured to perform the expansion-contraction vibration in a plane along the surface of the substrate when the voltage is applied to the at least one electrode.

6. The resonator according to claim 5, wherein, in the first numerical range, when the number of the vibration regions to be formed in the vibrator is n, the value of the aspect ratio L/Wo is set in a range of $1.0n \leq L/Wo < 1.45n$.

7. The resonator according to claim 1,
wherein, in the vibrator, a region in which a node of the expansion-contraction vibration is formed is based on the value of the aspect ratio L/Wo, and
wherein, in a second numerical range of the value of the aspect ratio L/Wo, the second numerical range is a range in which a displacement amount of the expansion-contraction vibration in the length direction is negative at a center of the vibrator in the width direction.

8. The resonator according to claim 7, wherein the variant portion is set to a width Wm satisfying $Wm > Wo$.

9. The resonator according to claim 8,
wherein the substrate comprises silicon,
wherein the vibrator further includes a piezoelectric layer formed between the substrate and the at least one electrode, and
wherein the piezoelectric layer is configured to perform the expansion-contraction vibration in a plane along the surface of the substrate when the voltage is applied to the at least one electrode.

10. The resonator according to claim 9, wherein, in the second numerical range, the value of the aspect ratio L/Wo is set in a range of $1.45n \leq L/Wo < 2.0n$.

11. The resonator according to claim 1, wherein, in the vibrator, when an aspect ratio per each of the vibration regions of the vibrator is an effective aspect ratio x, and the number of the vibration regions to be formed is n, the effective aspect ratio x is set to:

$$\begin{cases} x = \dfrac{L}{Wo}, & (n = 1) \\ x = \left(\dfrac{L}{Wo}\right) \times \left(\dfrac{1.1}{n}\right), & (n \geq 2) \end{cases}.$$

12. The resonator according to claim 11, wherein, in the vibrator, the length direction or the width direction is a direction along a plane of a silicon forming the substrate.

13. The resonator according to claim 12, wherein the width Wm of the variant portion is set based on the width Wo of the vibrator to $0.31x + 0.35 \leq Wm/Wo \leq 0.97x - 0.22$.

14. The resonator according to claim 12, wherein a volume Vm of the vibrator is set with respect to a product Vo of the length L, the width Wo, and a thickness T of the vibrator to $0.13x + 0.73 \leq Vm/Vo \leq 0.58x + 0.26$.

15. The resonator according to claim 11,
wherein, in the vibrator, the length direction or the width direction is a direction along a plane of a silicon forming the substrate, and
wherein the width Wm of the variant portion is set based on the width Wo of the vibrator to $0.16x + 0.56 \leq Wm/Wo \leq 0.25x + 0.63$.

16. The resonator according to claim 11,
wherein, in the vibrator, the length direction or the width direction is a direction along a plane of a silicon forming the substrate, and
wherein a volume Vm of the vibrator is set with respect to a product Vo of the length L, the width Wo, and a thickness T of the vibrator to $0.08x + 0.77 \leq Vm/Vo \leq 0.14x + 0.84$.

17. The resonator according to claim 1, wherein the holding arm is connected, at an end of the vibrator in the length direction, to a center portion in the width direction.

18. A resonance device comprising:
the resonator according to claim 1;
a cover body that covers the resonator; and
an outer electrode.

* * * * *